United States Patent [19]
Funari et al.

[11] Patent Number: 5,222,649
[45] Date of Patent: Jun. 29, 1993

[54] APPARATUS FOR SOLDERING A SEMICONDUCTOR DEVICE TO A CIRCUITIZED SUBSTRATE

[75] Inventors: Joseph Funari, Vestal; Ronald J. Moore, Binghamton, both of N.Y.

[73] Assignee: International Business Machines, Armonk, N.Y.

[21] Appl. No.: 973,800

[22] Filed: Nov. 9, 1992

Related U.S. Application Data

[63] Continuation of Ser. No. 763,734, Sep. 23, 1991.

[51] Int. Cl.⁵ .................. B23K 3/04; B23K 37/04
[52] U.S. Cl. .................. 228/6.2; 228/44.7; 228/20
[58] Field of Search .............. 228/173.2, 180.2, 228, 228/44.7, 6.2, 242, 232, 20

[56] References Cited

U.S. PATENT DOCUMENTS

| | | | |
|---|---|---|---|
| 4,564,135 | 1/1986 | Barresi et al. | 228/180.2 X |
| 4,787,548 | 11/1988 | Abbagnaro | 228/44.7 |
| 4,799,617 | 1/1989 | Friedman | 228/44.7 X |
| 4,844,325 | 7/1989 | Nishiguchi et al. | 228/180.2 |
| 4,937,006 | 6/1990 | Bickford et al. | 228/219 |
| 4,979,664 | 12/1990 | Lyons et al. | 228/180.2 |

FOREIGN PATENT DOCUMENTS 2351056  6/1974  Fed. Rep. of Germany ... 228/180.2

OTHER PUBLICATIONS

IBM Technical Disclosure Bulletin, "Solder Reflow Tool", vol. 11, No. 10, Mar. 1969, p. 1298.
IBM Technical Disclosure Bulletin, "Hot Gas Gun", vol. 15, No. 3, Aug. 1972, pp. 822–823.
IBM Technical Disclosure Bulletin, "Robotic Hot Air Solder/Desolder Placement Device", vol. 30, No. 1, Jun. 1987, p. 114.
Surface Mount Technology, "How to Use Integral Vision and Reflow for Placement of Fine Pitch SMCs", Feb. 1987, pp. 31–32.

Primary Examiner—Richard K. Seidel
Assistant Examiner—Jeanne M. Elpel
Attorney, Agent, or Firm—Lawrence R. Fraley

[57] ABSTRACT

An apparatus for bonding a semiconductor device onto a substrate (e.g., a printed circuit board) such that solder elements on the device are connected, respectively, to circuit elements on the substrate. The solder elements are heated by passing hot gas onto an opposing surface of the device such that, by heat transference, the solder elements become partially molten to form the desired connections. Pressure is also applied onto the device during this formation to assure planarity at the connection sites. Following formation, cooling of the connections is accomplished. By directing heated gas onto only the semiconductor device and not onto the solder element-circuit member locations (and thus onto the substrate), direct semiconductor device bonding to lower melting point temperature substrates (e.g., those circuit boards containing fiberglass reinforced epoxy resin as a dielectric) may be achieved.

7 Claims, 3 Drawing Sheets

APPARATUS FOR SOLDERING A SEMICONDUCTOR DEVICE TO A CIRCUITIZED SUBSTRATE

This is a divisional of Ser. No. 07/763,734 filed Sep. 23, 1991.

TECHNICAL FIELD

The invention relates to electrically connecting semiconductor devices (chips) to circuitized substrates and more particularly to connecting such devices using solder.

CROSS-REFERENCE TO COPENDING APPLICATIONS

In Ser. No. (S.N.) 07/578,711, entitled "Method of Bonding Thin Film Electronic Device" (filed Sep. 7,1990), there is defined a method of bonding a flexible film carrier to a semiconductor device by directing hot gas directly onto conductive leads of the carrier as these rest on solder mounds located on the device's contact sites. The heated leads and solder mounds form a connection. Ser. No. 07/578,711 is now U.S. Pat. No. 5,057,969.

In Ser. No. 07/725,415, entitled "Localized Soldering, Station Using State Changing Medium" (filed Jul. 1, 1991), there is defined a localized soldering station that uses the vapor phase reflow principle. A quartz nozzle is used to confine the vapor to the part being attached and its solder connections. Ser. No. 07/725,415 is now U.S. Pat. No. 5,102,028 and is a continuation of Ser. No. 07/503,320, filed Apr. 2, 1990 and now abandoned.

Both of these application are assigned to the same assignee as the present invention.

BACKGROUND OF THE INVENTION

The present invention, as defined, involves the bonding of a semiconductor device (chip) to a circuitized substrate, the substrate preferably a printed circuit board. Typically, such boards are comprised of dielectric material such as epoxy resin reinforced with fiberglass, and include a plurality of conductive layers (referred to as signal, power and/or ground planes) as part thereof. One particular advantage of directly bonding a semiconductor chip onto a printed circuit board is the elimination of an interim substrate as has been typically used in the art, one example being referred to as a flexible (or thin) film carrier. Such a carrier is described in the aforementioned U.S. Pat. No. 5,057,969, as well as in U.S. Pat. Nos. 4,937,006, 4,962,416 and 4,914,551, the disclosures of which are incorporated herein by reference.

In the structures defined in these patents and application, the chip is typically bonded initially to the conductive leads (e.g., copper) of the carrier and this chip-carrier subassembly is then bonded to respective circuit (contact) sites or members on the next substrate (typically, a printed circuit board). This combined structure is then typically incorporated into the remaining electrical portions of a larger assembly (e.g., a processor) which in turn may form part of an information handling system (also known as a computer). In the processes for achieving such bonding between chip and carrier, as well as in processes wherein chips have been directly bonded to other circuitized substrates (e.g., metallized ceramic substrates), solder connections have often been utilized with hot gas directed onto the lead and/or solder junctions. U.S. Pat. No. 4,937,006 defines such a process. U.S. Pat. No. 5,057,969 also defines use of hot gas impingement, but primarily onto the copper leads, which in turn assist in heating portions of the respective solder mounds to which these are engaged. Such direct hot gas impingement onto the circuitry and adjoining surface of an epoxy resin dielectric circuit board may prove deleterious because of the lower melting point of this dielectric, in comparison to the much higher temperature ceramic and similar substrate materials.

Understandably, elimination of an interim carrier thus results in a substantial reduction in the processes, costs and time involved in making such products. As defined herein, the invention provides such distinct advantages over processes and structures as described in the foregoing patents and application in a new and unique manner. Significantly, the invention provides such connections without direct gas impingement onto the solder elements (also referred to as solder mounds or solder balls) used to form such connections. Because an interim carrier is eliminated, the conductive (copper) leads associated therewith are also removed, such that the method of connection provided by the instant invention is directly between the chip's solder elements and circuitry located on the surface of the substrate to which the chip is to be bonded. Of further significance, the avoidance of direct hot gas impingement on leads and/or substrate (including the circuitry thereof) enables direct device attachment to less costly substrates of lower melting point dielectrics (e.g., epoxy resin).

It is believed that such a form of connection will constitute a significant advancement in the art.

DISCLOSURE OF THE INVENTION

It is, therefore, a primary object of this invention to enhance the art of bonding semiconductor devices to circuitized substrates.

It is another object of the invention to provide a method for achieving effective electrical connections between solder elements of a semiconductor device and respective circuit members of such a substrate.

It is a more particular object of the invention to provide such a method wherein such connections are formed using hot gases and the advantages associated therewith but wherein direct impingement onto the solder elements and/or conductive leads is substantially eliminated.

It is yet another object of the invention to provide an apparatus for accomplishing such soldering.

In accordance with one aspect of the invention, there is defined a method of soldering a semiconductor device having a plurality of solder elements located along a first surface thereof to a substrate having a plurality of circuit members wherein the method comprises the steps of aligning the semiconductor device relative to the substrate such that selected ones of the solder elements are aligned with respective ones of the circuit members on the substrate, applying force onto a second surface of the semiconductor device to cause the selected solder elements to engage the aligned respective circuit elements, applying heat to substantially only the second surface of the semiconductor device during the application of force to cause at least partial reflow of the selected solder elements engaging the respective circuit elements, cooling the selected solder elements to cause at least partial solidification thereof during the application of force, and removing the force from the semiconductor device.

In accordance with another aspect of the invention, there is defined an apparatus for soldering a semiconductor device having a plurality of solder elements located along a first surface thereof to a substrate having a plurality of circuit members thereon, the apparatus comprising means for aligning the semiconductor device relative to the substrate such that selected ones of the solder elements are aligned with respective ones of the circuit members on the substrate, means for applying force onto a second surface of the semiconductor device to cause the selected solder elements to engage the aligned respective circuit elements, means for applying heat to substantially only the second surface of the semiconductor device during this application of force to cause at least partial reflow of the selected solder elements, and means for cooling the selected solder elements to cause at least partial solidification thereof during the application of force.

BEST MODE FOR CARRYING OUT THE INVENTION

Figure 1:
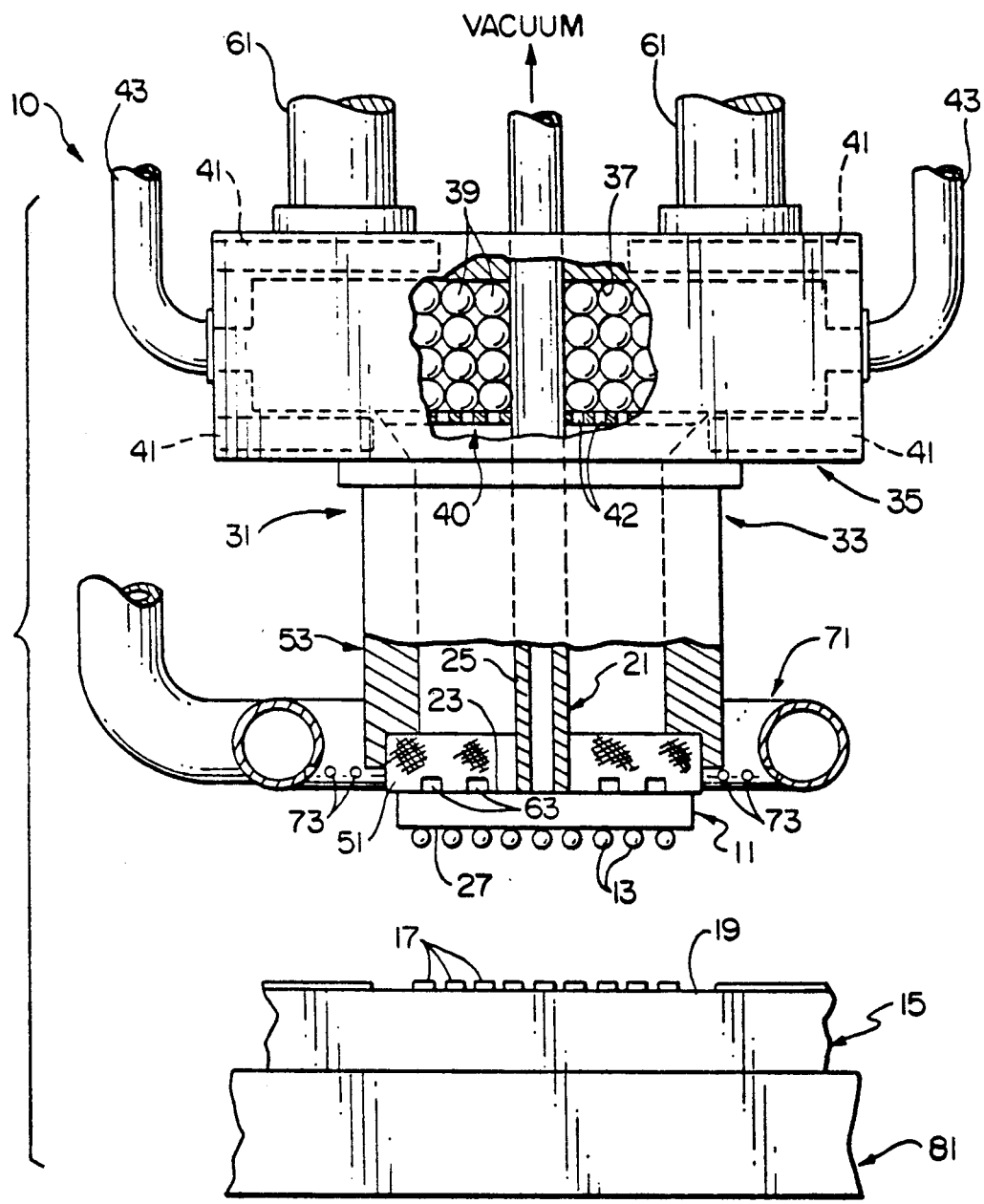
FIGS. 1-3 illustrate the various steps, and an apparatus for performing same, of a method of soldering a semiconductor device to a circuitized substrate in accordance with a preferred embodiment of the invention.

For a better understanding of the present invention, together with other and further objects, advantages and capabilities thereof; reference is made to the following disclosure and appended claims in connection with the above-described drawing.

In the drawings, there is shown an apparatus 10 for soldering a semiconductor device 11 having a plurality of solder elements 13 thereon to a substrate 15 such that solder elements 13 are individually connected, electrically, to respective circuit members 17 located on an upper surface 19 of substrate 15. As mentioned above, the preferred substrate for having semiconductor device 11 positioned thereon and coupled thereto is a multilayered printed circuit board, several types of which are known in the art. Typically, these substrates are comprised of a dielectric material having therein a plurality of spaced, conductive (e.g., copper) planes which function as signal, power and/or ground members. As mentioned, the invention is especially adapted for connecting devices (chips) to substrates having lower melting point dielectric materials such as fiberglass reinforced epoxy resin. Such substrates are, typically, of lower cost than most higher melting point dielectric substrates. In the substrate 15 described and illustrated herein, at least one such conductive layer is located on a surface (19) thereof and includes the aforedefined circuit members 17. Each circuit member 17 may in turn comprise a conductive, metallic (e.g., copper) pad of specific configuration (e.g., round or rectangular) and spaced from other, adjacent pads in a predetermined pattern. In one embodiment of the invention, members 17 were of rectangular configuration and possessed external dimensions of about 0.002 inch by 0.005 inch, with a corresponding thickness of only about 0.0014 inch. Understandably, circuit members 17 may be connected to other circuit structure which may also be located on surface 19, or, alternatively, these members may be connected to various internal circuitry of substrate 17 (e.g., by known plated-through-holes or the like). The aforementioned close spacing defines what is clearly understood to be a highly dense pattern of such circuit members.

Semiconductor device (chip) 11, as shown in the drawings, is maintained within apparatus 10 using a suction device 21 which applies a predetermined suction force against an upper surface 23 of device 11 to positively retain the device in precise alignment. Suction device 21, as shown, preferably comprises an elongated tube member 25 substantially centrally disposed within apparatus 10 and extending thereabove for being operatively connected to a suitable vacuum source (not shown) which, when actuated, provides the necessary suction force to hold device 11. Device 11 is shown in such a retained position in FIG. 1. Apparatus 10, as shown in FIG. 1, aligns device 11 such that the individual solder elements 13 are respectively aligned above each of the circuit members 17. Additional means not shown herein, including television cameras or the like, may be used to assure such precise alignment at this stage.

Each solder element 13 is preferably of substantially spherical configuration, having a diameter within the range of from about 0.004 inch to about 0.005 inch. Each element in turn is secured to (and thus electrically connected to) a respective contact site (not shown) on the bottom surface 27 of device 11. Such contact sites are known in the semiconductor chip art and further description is thus not believed necessary. Significantly, each solder element is preferably of 3:97 tin:lead solder composition wherein the tin comprises about three percent by weight of the total composition and the lead comprises about ninety-seven percent by weight of the remainder. Use of this solder composition for providing connections between circuitized substrates and other semiconductor devices is known in the art and further description is not believed necessary. Of importance, however, the described solder composition possesses a melting point temperature of about 310 degrees Celsius (C).

Figure 2:
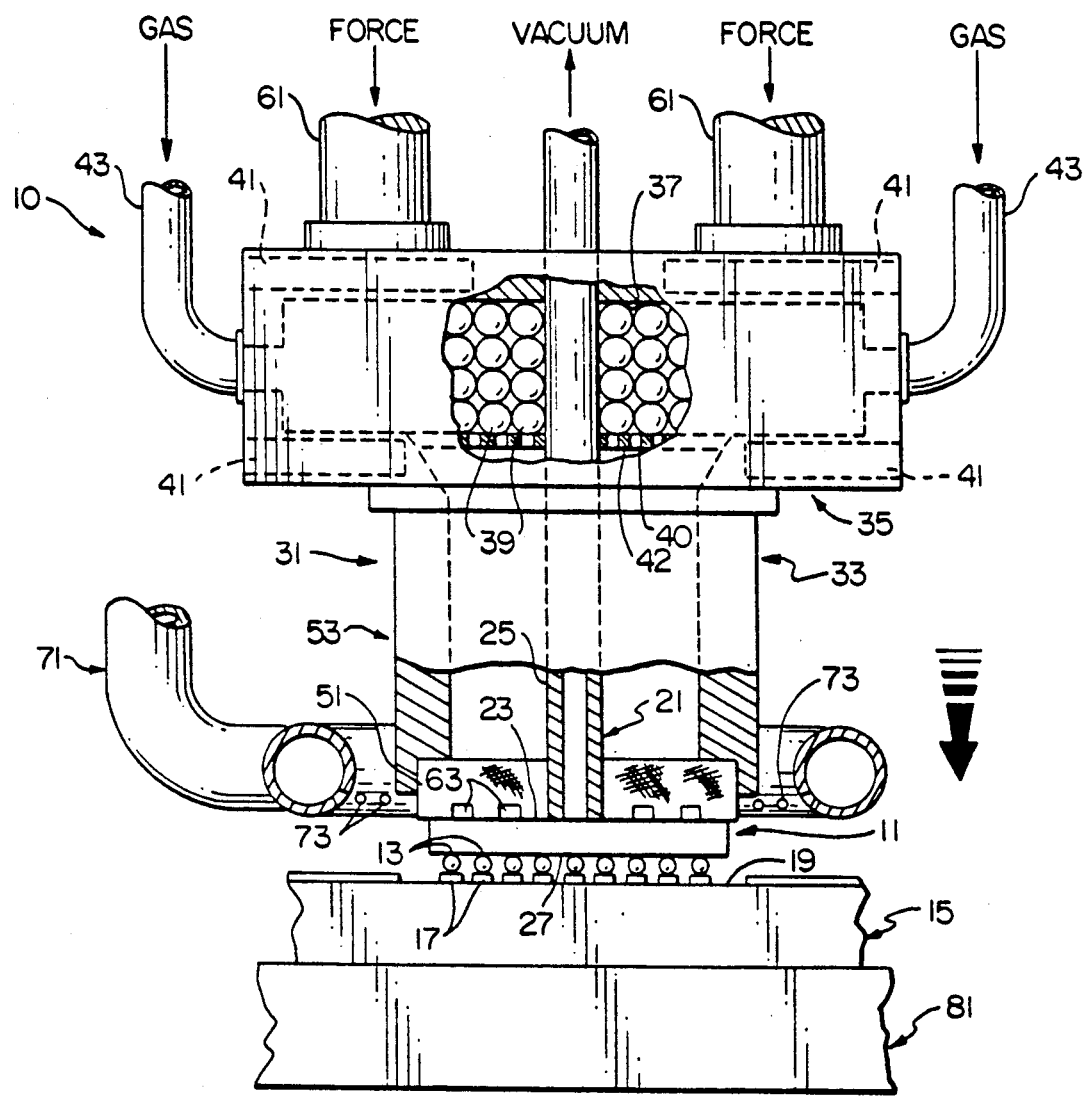

As shown in the drawings, apparatus 10 further includes means 31 for applying heat to semiconductor device 11 to perform the method as taught herein. Means 31 preferably comprises a conduit member 33 which, at one end portion 35 thereof defines a central chamber 37 having therein a plurality of metallic members 39. As defined herein, members 39 are preferably high-heat capacity elements such as stainless steel, nickel, copper, ceramics and the like. In one embodiment, a total of about twelve hundred stainless steel spherical balls were used, each having an outer diameter of about 0.0935 inch. Members 39 are preferably retained within chamber 37 and prevented from passing into the other, lower end of conduit 33 by a screen 40 having several openings 42 therein through which the heated gas will pass. As stated, these members are preferably spherical in configuration, but such configuration is not meant to limit the invention. In operation, members 39 are heated to an elevated temperature using at least one heater 41 located within end portion 35. Preferably, a total of four such heaters 41 are utilized, as shown in the drawings. A preferred heater can be an electrical heating coil, cartridge heater or any other of several types of heaters known in the art. Understandably, the function of heaters 41 is to raise the temperature of the metallic members 39 such that when gas is passed thereover, this gas is heated to a desired temperature sufficient to perform in accordance with the teachings herein. A preferred gas for this use is an inert gas, a preferred example being nitrogen. Such gas is introduced within chamber 37 from a pair of inlet tubes 43 during the bonding operation described hereinabove (FIG. 2).

Apparatus 10 further includes what will be defined as a porous member 51 located at a second end portion 53 of conduit 33. As shown in the drawings, this second end portion 53 is oriented substantially perpendicularly to the longitudinal first end 35 containing chamber 37 therein. In operation, heated gas passing from chamber 37 thus passes substantially perpendicularly downwardly through the end portion 53 and, as understood, through porous member 51. By the term porous member as used herein is meant to define a structure which provides positive engagement with semiconductor device 11 (along an upper surface 23 thereof) while also, significantly, permitting passage of the desired hot gas therethrough. In a preferred example of the invention, porous member 51 comprised a stainless steel mesh screen having a thickness within the range of from about 0.03 inch to about 0.06 inch. Another material which may be also successfully used for member 51 is a sintered metal, including sintered stainless steel. Yet another material suitable for porous member 51 is Inconel. (Inconel is a trademark of the International Nickel Company, Inc.) As shown, porous member 51 is secured to or forms part of conduit 33. Preferably, member 51 is secured within a recessed end portion of the second end portion 53 in the manner depicted in the drawings.

With semiconductor device 11 in position (FIG. 1), apparatus 10 is lowered such that each of the solder elements 13 physically engages a respective circuit member 17. At this time, heaters 41 have heated the contained members 39 to desired operating temperature. Each of the solder elements is maintained against the respective circuit members by application of a predetermined force by apparatus 10 against the upper surface 23 of device 11. This is shown in FIG. 2 by the words "FORCE" to indicate suitable means (e.g., pistons 61) operatively connected to conduit 33 for exerting this desired force thereagainst and thus against device 11. It is understood that the invention is not limited to the use of pistons or the like in that several other means may be readily utilized to accomplish this purpose. Using the aforementioned solder composition and the gas and temperature thereof as defined hereinbelow, a sufficient force was applied against device 11 such that the resulting weight on each solder element was within the range of from about 3 to about 10 grams per element. Such total weight, as applied, substantially assures planarity of the contacting surfaces of the elements against the corresponding array of circuit members 17.

With device 11 in position (FIG. 2), heated gas is now passed through porous member 51 and onto the upper surface 23 of the device. Of significance, this heated gas, preferably at a temperature slightly greater than the melting point of the solder elements 13, is directed substantially only onto surface 23 and does not impinge directly onto elements 13, members 17, or the upper surface 19 of substrate 15. The heated gas, after impinging on surface 23 at this desired temperature (in one embodiment of the invention, at 320 degrees C.), passes out through openings 63 spacedly located within the bottom surface thereof. This escaping gas is thus directed substantially away from the solder element-circuit member connections, and away from substrate 15.

In accordance with the teachings herein, it is understood that heat transference through semiconductor device 11 constitutes the primary means for heating the solder elements 13 located on an opposing surface of the device 11 from that surface which directly receives the heated gas. It has been determined that applying gas at the temperatures defined herein will have no adverse affect on the resulting operational capabilities of the semiconductor device. This method, as defined herein, thus assures the formation of such connections without requiring additional apparatus structure for directing such gas.

At the above gas temperature (e.g., 320 degrees C.), it was only necessary in one embodiment of the invention to provide gas to conduit 33 for a period of from about 0.1 seconds to about 5.0 seconds. In a more particular example, the gas was applied for only about 2.0 seconds at the above temperature. As stated, the heated gas (e.g., nitrogen), does not directly impinge on solder elements 13 and circuit members 17 and also, significantly, not on the upper surface of substrate 15. This is considered important because of the lower melting point temperature for the materials (e.g., epoxy resin) typically used as part of such substrates.

During the relatively brief gas application, it has been determined that the body of device 11 along the opposing surface (27) will reach a temperature of about 280 degrees C. to about 300 degrees C. Using copper circuit members having a preferred strike of precious metal (e.g., gold) thereon, it has been determined that when this opposing surface temperature reaches approximately 250 degrees C., the lead from the tin:lead solder will combine with the precious metal to form a first alloy. When this opposing surface temperature reaches approximately 280 degrees C., it has been determined that the precious metal (gold) combines with the tin from the solder to form a second alloy (gold-tin). Thus, at least two alloys are formed at this intersection during formation of the solder to circuit member bond. Of further significance, and as indicated above, the temperature along opposing surface 27 is slightly less than the melting point of the solder elements positioned on device 11 and now in contact with respective members 17. The temperature reached (e.g., 300 degrees C.), however, is sufficient to cause partial solder reflow to form the alloys defined above and complete the desired connections for these elements. It is thus not necessary, significantly, to completely reflow the entire solder mass for each element in order to accomplish the unique teachings of the present invention.

It is understood, as shown in FIG. 2, that the appropriate suction force is maintained against semiconductor device 11 during the aforedefined solder-member connection formation. This suction force is also maintained against device 11 during the next step in the operation, that being to cool the formed connections. A preferred means for achieving such cooling is to pass inert gas (e.g., nitrogen) through an apertured tubing member 71, which, as depicted in the drawings, substantially encircles the bottom (second) end portion 53 of conduit 33 such that a plurality of apertures 73 formed therein are aimed substantially directly toward the respective locations of these connections (FIG. 2) during the cooling cycle. By the term cooling gas is meant to define a gas which serves to cool the molten solder connections sufficient to result in substantial solidification thereof.

For purposes of the invention, nitrogen gas at approximately 22 degrees C. was passed through the apertured tubing 71 and directly onto the solder element-circuit member connections. This occurred for only about 3.5 seconds.

Figure 3:
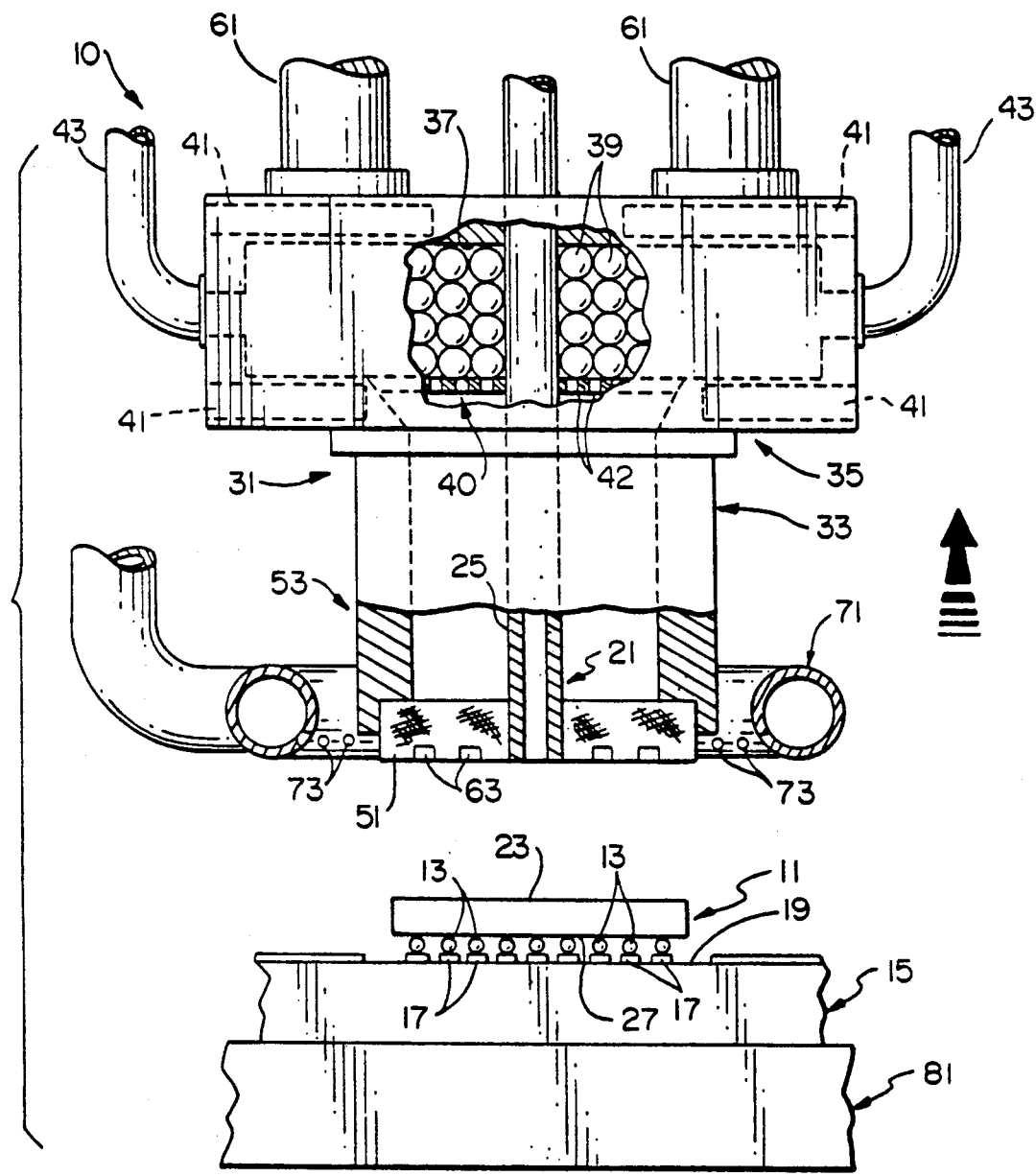

With solidification of the solder elements having occurred, apparatus 10 is now withdrawn to the position depicted in FIG. 3. Understandably, the suction force applied on device 11 has been removed.

In addition to passing cooling gas through apertures 73 of an element such as tubing 71, it is possible to use other means for accomplishing this cooling. For example, several individual external nozzles (not shown) may be strategically located about the connection site and aimed directly onto the locations wherein such connections are formed.

To facilitate formation of the above solder element-circuit member connections, it may be desirable to preheat the printed circuit board substrate 15 to a predetermined temperature prior to gas impingement onto device 11. If desired, this may be accomplished using a suitable preheater 81 upon which substrate 11 may rest. This preheater may be an electrical coil, cartridge heater or the like and preferably will reach a temperature of about 120 degrees C., to in turn raise the temperature of substrate 15 to about 100 degrees C. Heating the board to this temperature has also proven to not have any adverse effects on the circuit board materials as defined herein.

Thus it has been shown and described a method and apparatus for providing sound electrical connections between solder elements located on a surface of a semiconductor device and respective circuit members located on a surface of an adjacent substrate such as a printed circuit board. The invention as defined herein is capable of being readily utilized in mass production, to realize the several advantages associated therewith. Significantly, the invention provides a means whereby heated gas is utilized to accomplish partial reflow of the solder elements which are connected to the surface of the device while assuring that such heated gas is not directed onto these elements and, significantly, the substrate supporting the circuit members to which these are attached. The invention thus allows for the direct connection of semiconductor devices onto printed circuit boards of relatively low melting point temperature materials such as known epoxy resin reinforced with fiberglass. Such materials are, understandably, less expensive than more exotic, higher melting point temperature materials for possible use in board members, one example being Teflon. (Teflon is a trademark of E. I. duPont de Nemours and Company.) This assures even further cost savings for the final product produced in accordance with the teachings herein.

While there have been shown and described what are at present considered the preferred embodiments of the invention, it will be obvious to those skilled in the art that various changes and modifications may be made therein without departing from the scope of the invention as defined by the appended claims.

What is claimed is:

1. An apparatus for soldering a semiconductor device having a plurality of solder elements located along a first surface thereof to a substrate having a plurality of circuit members thereon, said apparatus comprising:
    means for aligning said semiconductor device relative to said substrate such that selected ones of said solder elements are aligned with respective ones of said circuit members on said substrate;
    means for engaging and applying force onto a second surface of said semiconductor device to cause said selected solder elements to engage said aligned respective circuit elements;
    means for applying heat directly onto said second surface of said semiconductor device during said application of force, said semiconductor device conducting heat to cause at least partial reflow of said selected elements engaging said respective circuit elements, said solder elements heated primarily by conductive heat from said semiconductor device; and
    means for cooling said selected solder elements to cause at least partial solidification thereof during said application of said force.

2. The apparatus according to claim 1 wherein said means for aligning said semiconductor device comprises a suction device for engaging said semiconductor device along said second surface and applying a suction force thereagainst to retain said semiconductor device in fixed alignment against said suction device.

3. The apparatus according to claim 1 wherein said means for applying heat to said semiconductor device comprises a conduit member for directing heated gas onto substantially only said second surface of said semiconductor device.

4. The apparatus according to claim 3 wherein said conduit member includes a chamber having a plurality of metallic members therein and means for heating said metallic members within said chamber to an pre-established temperature, said metallic members heating said gas when said gas is passed thereover.

5. The apparatus according to claim 4 wherein said means for heating said metallic members comprises at least one heater member located within said conduit member relative to said metallic members.

6. The apparatus according to claim 4 further including a porous member secured to or forming part of said conduit member for engaging said semiconductor device, said heated gas passing through said porous member.

7. The apparatus according to claim 3 wherein said means for cooling said selected solder elements comprises an apertured tubing member located substantially adjacent said conduit member for directing cooling gas onto said selected solder elements.

* * * * *